US012695071B2

(12) United States Patent
    Parkhe

(10) Patent No.: US 12,695,071 B2
(45) Date of Patent: Jul. 28, 2026

(54) SUBSTRATE SUPPORT ASSEMBLY WITH IMPROVED THERMAL UNIFORMITY

(71) Applicant: Applied Materials, Inc., Santa Clara, CA (US)

(72) Inventor: Vijay D. Parkhe, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 326 days.

(21) Appl. No.: 18/244,180

(22) Filed: Sep. 8, 2023

(65) Prior Publication Data

US 2025/0087468 A1    Mar. 13, 2025

(51) Int. Cl.
    *B23Q 3/00*    (2006.01)
    *H01J 37/32*    (2006.01)

(52) U.S. Cl.
    CPC ... *H01J 37/32724* (2013.01); *H01J 2237/002* (2013.01); *H01J 2237/2007* (2013.01)

(58) Field of Classification Search
    CPC    H01J 37/32724; H01J 37/32715; B23Q 3/00; B23Q 3/06
    See application file for complete search history.

(56) References Cited

U.S. PATENT DOCUMENTS

| | | | | |
|---|---|---|---|---|
| 10,745,805 | B2 * | 8/2020 | Firouzdor | ............. C23C 16/403 |
| 2007/0030621 | A1 | 2/2007 | Gaff et al. | |
| 2014/0203526 | A1 * | 7/2014 | Banda | ................. B28D 5/0082 |
| | | | | 279/128 |

| | | | | |
|---|---|---|---|---|
| 2016/0111315 | A1 * | 4/2016 | Parkhe | ............. H01L 21/68785 |
| | | | | 361/234 |
| 2017/0345691 | A1 * | 11/2017 | Parkhe | ............. H01L 21/67109 |
| 2024/0395591 | A1 * | 11/2024 | Parkhe | ............... H01L 21/6833 |
| 2025/0087468 | A1 * | 3/2025 | Parkhe | ............. H01J 37/32724 |
| 2025/0100263 | A1 * | 3/2025 | Chadha | ............. H01L 21/67109 |
| 2025/0118586 | A1 * | 4/2025 | Chadha | ............. H01L 21/68757 |

FOREIGN PATENT DOCUMENTS

| | | |
|---|---|---|
| CN | 102456604 A | 5/2012 |
| JP | 2017143182 A | 8/2017 |
| JP | 2021012928 A | 2/2021 |

OTHER PUBLICATIONS

International Search Report and Written Opinion for International Application No. PCT/US2024/044512, mailed Dec. 10, 2024, 10 Pages.

* cited by examiner

*Primary Examiner* — Lee D Wilson
(74) *Attorney, Agent, or Firm* — Lowenstein Sandler LLP

(57)    ABSTRACT

Methods for improving thermal uniformity on a surface of a substrate support assembly. One method includes temporarily clamping a ceramic puck plate to a cooling plate of a substrate support assembly with one or more layers of bonding material between the ceramic puck and the cooling plate. The method further includes heating the ceramic puck plate to a target temperature, cooling the cooling plate to an operating temperature, and recording temperatures at a plurality of locations on a substrate support surface of the ceramic puck plate. The method further includes modifying, based on the recorded temperatures, one or more properties of the one or more layers of the bonding material to achieve a target temperature profile on the substrate support surface.

20 Claims, 10 Drawing Sheets

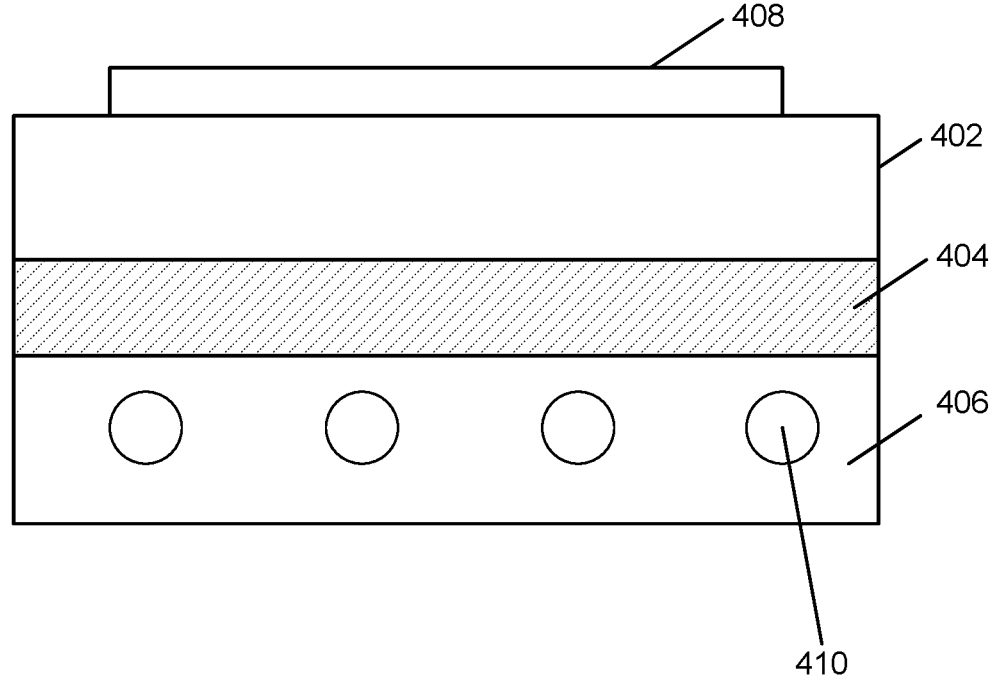
FIG. 4

600

| Region | Temperature (DegC) | Average Temp. (DegC) | Delta (DegC) | Thickness correction (microns) |
|--------|--------------------|--------------------|--------------|--------------------------------|
| 1 | 71 | 70.76 | 0.24 | -0.48 |
| 2 | 70 | 70.76 | -0.76 | 1.52 |
| 3 | 72 | 70.76 | 1.24 | -2.48 |
| 4 | 73 | 70.76 | 2.24 | -4.48 |
| 5 | 71 | 70.76 | 0.24 | -0.48 |
| 6 | 69 | 70.76 | -1.76 | 3.52 |
| 7 | 70 | 70.76 | -0.76 | 1.52 |
| 8 | 72 | 70.76 | 1.24 | -2.48 |
| 9 | 68 | 70.76 | -2.76 | 5.52 |
| 10 | 70 | 70.76 | -0.76 | 1.52 |
| 11 | 73 | 70.76 | 2.24 | -4.48 |
| 12 | 72 | 70.76 | 1.24 | -2.48 |
| 13 | 71 | 70.76 | 0.24 | -0.48 |
| 14 | 70 | 70.76 | -0.76 | 1.52 |
| 15 | 68 | 70.76 | -2.76 | 5.52 |
| 16 | 69 | 70.76 | -1.76 | 3.52 |
| 17 | 71 | 70.76 | 0.24 | -0.48 |
| 18 | 73 | 70.76 | 2.24 | -4.48 |
| 19 | 72 | 70.76 | 1.24 | -2.48 |
| 20 | 70 | 70.76 | -0.76 | 1.52 |
| 21 | 71 | 70.76 | 0.24 | -0.48 |

602  604  606  608  610

900

902

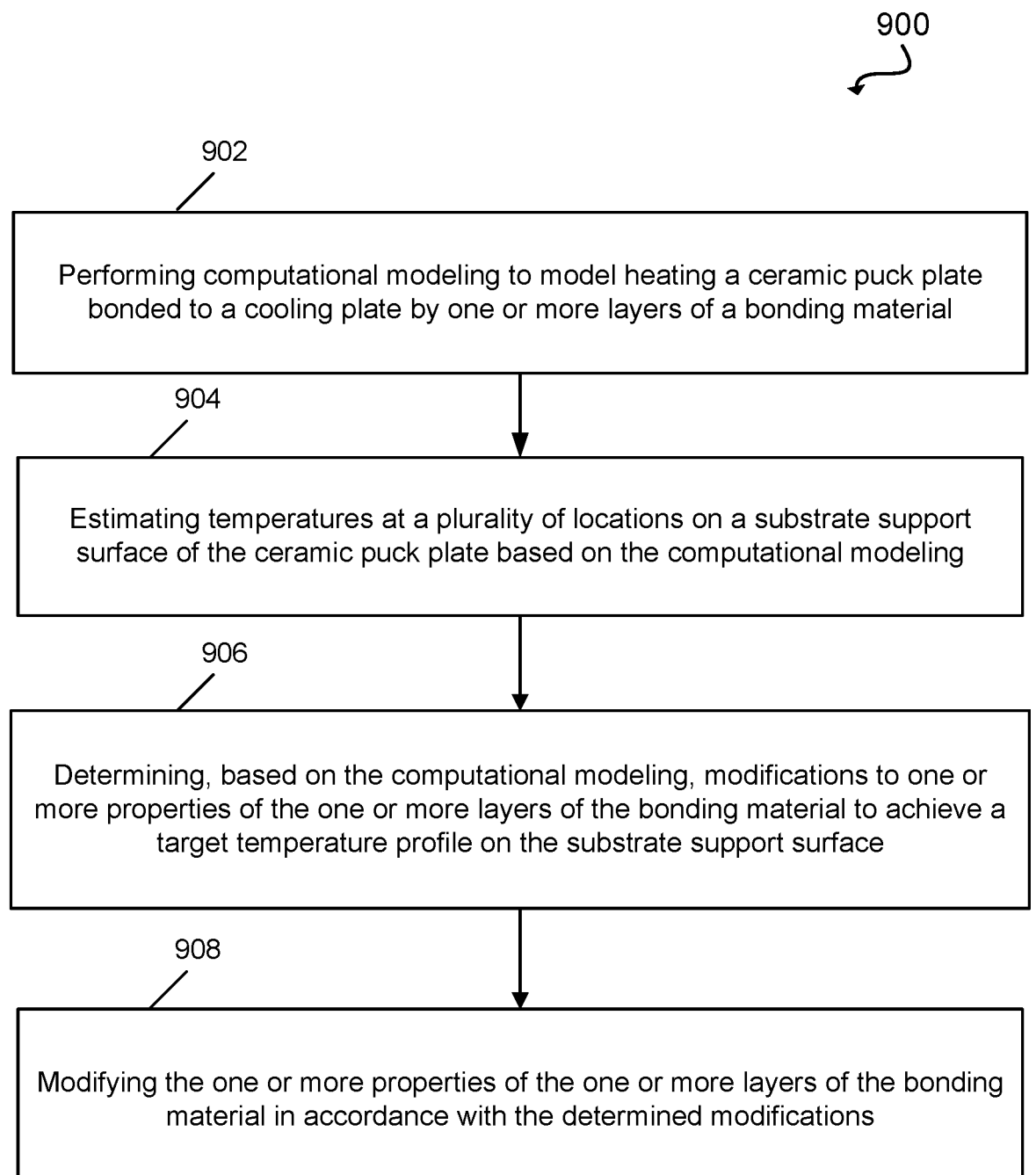

Performing computational modeling to model heating a ceramic puck plate bonded to a cooling plate by one or more layers of a bonding material

904

Estimating temperatures at a plurality of locations on a substrate support surface of the ceramic puck plate based on the computational modeling

906

Determining, based on the computational modeling, modifications to one or more properties of the one or more layers of the bonding material to achieve a target temperature profile on the substrate support surface

908

Modifying the one or more properties of the one or more layers of the bonding material in accordance with the determined modifications

FIG. 9

SUBSTRATE SUPPORT ASSEMBLY WITH IMPROVED THERMAL UNIFORMITY

TECHNICAL FIELD

Some embodiments of the present disclosure relate, in general, to a substrate support assembly with improved thermal uniformity on a substrate support surface.

BACKGROUND

Electrostatic chucks are widely used to hold substrates, such as semiconductor wafers, during substrate processing in processing chambers. Electrostatic chucks typically include one or more electrodes embedded within a unitary chuck body which includes a dielectric or semi-conductive ceramic material across which an electrostatic clamping field can be generated.

Electrostatic chucks offer several advantages over mechanical clamping devices and vacuum chucks. For example, electrostatic chucks reduce stress-induced cracks caused by mechanical clamping, allow larger areas of the substrate to be exposed for processing (little or no edge exclusion), and can be used in low pressure or high vacuum environments. Additionally, the electrostatic chuck can hold the substrate more uniformly to a chucking surface to allow a greater degree of control over substrate temperature.

Substrate support assemblies, such as electrostatic chucks, may not exhibit a uniform temperature profile when they are in operation. The non-uniformity in temperature may be because of variation in resistances of a heating elements, variation in radio frequency (RF) elements embedded in the electrostatic chuck, variation in material density of the electrostatic chuck, and/or other operational factors. These variations greatly impact the heating of the wafer on the substrate support surface, and the non-uniformity in the temperature profile of the substrate support surface may impact the material properties of the substrate being processed.

SUMMARY

Some embodiments of the present disclosure described herein cover a method for improving thermal uniformity of a substrate support surface of a substrate support assembly. The method includes temporarily clamping a ceramic puck plate to a cooling plate of a substrate support assembly with one or more layers of bonding material between the ceramic puck and the cooling plate. The method further includes heating the ceramic puck plate to a target temperature. The method further includes recording temperatures at a plurality of locations on a substrate support surface of the ceramic puck plate, and modifying, based on the recorded temperatures, one or more properties of the one or more layers of the bonding material to achieve a target temperature profile on the substrate support surface.

Some embodiments of the present disclosure described herein cover a method for improving thermal uniformity of a substrate support surface of a substrate support assembly. The method includes performing computational modeling to model heating a ceramic puck plate bonded to a cooling plate by one or more layers of a bonding material. The method further includes estimating temperatures at a plurality of locations on a substrate support surface of the ceramic puck plate based on the computational modeling. The method further includes determining, based on the computational modeling, modifications to one or more properties of the one or more layers of the bonding material to achieve a target temperature profile on the substrate support surface. The method further includes modifying the one or more properties of the one or more layers of the bonding material in accordance with the determined modifications.

Some embodiments of the present disclosure described herein cover a substrate support assembly with a uniform temperature profile (e.g., less than 1° C. variation) on a substrate support surface. The substrate support assembly includes one or more layers of an engineered bonding material disposed between a ceramic puck plate and a cooling plate. The engineered bonding material at least partially bonds the ceramic puck plate to the cooling plate. The engineered bonding material may include one or more first locations having a reduced thickness as compared to an average thickness of the one or more layers of the engineered bonding material. In another embodiment, the engineered bonding material may include one or more second locations including perforations that reduce a thermal conductivity of the one or more layers of the engineered bonding material at the one or more second locations. In another embodiment, the engineered bonding material may include one or more third locations including perforations at least partially filled with a second material that adjust the thermal conductivity of the one or more layers of the engineered bonding material at the one or more third locations.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 4 depicts a sectional side view of a substrate support assembly, in accordance with one or more embodiments;

FIG. 9 illustrates a method for improving thermal uniformity of a substrate support surface of a substrate support assembly, in accordance with one or more embodiments.

DETAILED DESCRIPTION OF EMBODIMENTS

Substrate support assemblies, such as electrostatic chucks, may perform as expected in a simulated environment. However, when they are in operation the temperature profile of the substrate support surface may not be uniform across the surface. The non-uniformity in temperature may be because of variation in resistances of the heating elements, variation in RF elements embedded in the puck plate, variation in material density of the puck plates, and/or other operational factors. These variations may impact the heating and/or cooling of the wafer on the substrate support surface, and the non-uniformity in the temperature profile of the substrate support surface may impact the material properties of the substrate being processed. In order to avoid or mitigate such imperfections, it is beneficial to have a uniform temperature profile (e.g., with less than 1° C. variation) across the substrate support surface.

Accordingly, embodiments of the present disclosure provide methods for improving thermal uniformity of a substrate support surface of a substrate support assembly. In embodiments, a substrate support assembly is temporarily assembled and thermally tested, and a bonding layer of the substrate support assembly is modified based on a result of the thermal testing. Modification of the bonding layer may include removing material from one or more regions of the bonding layer (e.g., by polishing, machining, or planarization), drilling holes in one or more regions of the bonding layer, filling drilled holes in one or more regions of the bonding layer with material having a higher or lower thermal conductivity than the bonding layer, and so on. In embodiments, a computer controlled laser machine may perform laser machining to remove thickness from the bonding layer (e.g., 1-100 microns of thickness), to drill holes in the bonding layer, and so on. Embodiments also relate to a substrate support assembly with a uniform temperature profile (e.g., with less than 1° C. variation) across a substrate support surface. The substrate support assembly may include a tailored bonding layer having one or more thinned regions (e.g., in which material has been removed), one or more regions with drilled holes, one or more regions with filled holes, and so on, which compensate for temperature non-uniformities caused by other components of the substrate support assembly and enable the uniform temperature profile at a surface of the substrate support assembly. Embodiments also relate to a computational model for simulating a temperature profile of a substrate support surface of a substrate support assembly and modifying one or more properties of a bonding material between a ceramic puck plate and a cooling plate of the substrate support assembly in order to achieve a uniform temperature profile (e.g., with less than 1° C. variation) across the substrate support surface.

Figure 1:
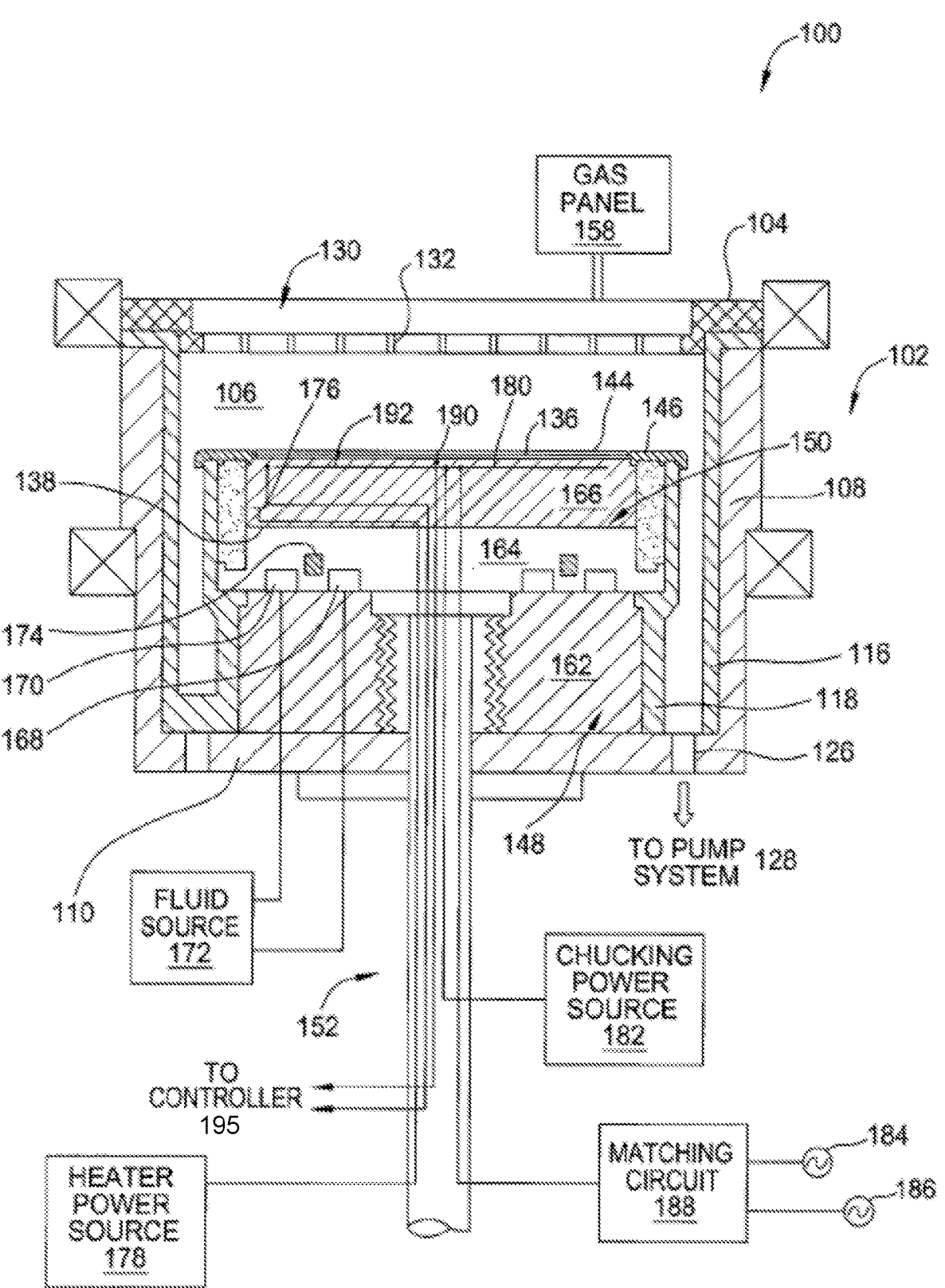
FIG. 1 depicts a sectional side view of one embodiment of a processing chamber.

FIG. 1 is a sectional view of one embodiment of a processing chamber 100 having a substrate support 150 disposed therein. The substrate support 150 may include an electrostatic puck 166, which may have a monolithic ceramic body or may have multiple puck plates bonded together (e.g., an upper puck plate bonded to a lower puck plate). The electrostatic puck 166 may additionally include more than two plates, where each plate may include zero or more different functional elements of the electrostatic chuck assembly (e.g., chucking electrodes, radiofrequency (RF) electrodes, main heating electrodes, auxiliary heating electrodes, cooling channels, and so on). The electrostatic puck 166 can be coupled to a cooling plate 164 by multiple fasteners, and/or by a bonding layer, as discussed in greater detail below. The bonding layer may be, for example, a metal bond, an organic bond, a polymer bond, a ceramic bond, etc.

The processing chamber 100 includes a chamber body 102 and a lid 104 that enclose an interior volume 106. The chamber body 102 may be fabricated from aluminum, stainless steel, or other suitable material. The chamber body 102 generally includes sidewalls 108 and a bottom 110. An outer liner 116 may be disposed adjacent the side walls 108 to protect the chamber body 102. The outer liner 116 may be fabricated and/or coated with a plasma or halogen-containing gas resistant material. In one embodiment, the outer liner 116 is fabricated from aluminum oxide. In another embodiment, the outer liner 116 is fabricated from or coated with yttria, yttrium alloy, or an oxide thereof.

An exhaust port 126 may be defined in the chamber body 102 and may couple the interior volume 106 to a pump system 128. The pump system 128 may include one or more pumps and throttle valves utilized to evacuate and regulate the pressure of the interior volume 106 of the processing chamber 100.

The lid 104 may be supported on the sidewall 108 of the chamber body 102. The lid 104 may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through a gas distribution assembly 130 that is part of the lid 104. Examples of processing gases that may be used to process in the processing chamber include halogen-containing gas, such as $C_2F_6$, $SF_6$, $SiCl_4$, HBr, $NF_3$, $CF_4$, $CHF_3$, $CH_2F_3$, $Cl_2$ and $SiF_4$, among others, and other gases such as $O_2$, or $N_2O$. Examples of carrier gases include $N_2$, He, Ar, and other gases inert to process gases (e.g., non-reactive gases). The gas distribution assembly 130 may have multiple apertures 132 on the downstream surface of the gas distribution assembly 130 to direct the gas flow to the surface of a substrate 144. Additionally, or alternatively, the gas distribution assembly 130 can have a center hole where gases are fed through a ceramic gas nozzle. The gas distribution assembly 130 may be fabricated and/or coated by a ceramic material, such as silicon carbide, Yttrium oxide, etc. to provide resistance to halogen-containing chemistries to prevent the gas distribution assembly 130 from corrosion.

In embodiments, a substrate support assembly 148 is disposed in the interior volume 106 of the processing chamber 100 below the gas distribution assembly 130. The substrate support assembly 148 includes substrate support 150 (e.g., including electrostatic puck 166 and cooling plate 164), a mounting plate 162 and/or a pedestal 152 in embodiments. The substrate support assembly 148 holds a substrate 144 during processing. An inner liner 118 may be coated on the periphery of the substrate support assembly 148. The inner liner 118 may be a halogen-containing gas resist material such as those discussed with reference to the outer liner 116. In one embodiment, the inner liner 118 may be fabricated from the same materials of the outer liner 116, or a different material.

In one embodiment, the substrate support assembly 148 includes a mounting plate 162 supporting a pedestal 152, and substrate support 150. In one embodiment, the substrate support 150 further includes a thermally conductive base referred to herein as a cooling plate 164 coupled to electrostatic puck 166 by multiple fasteners and/or by a bonding layer (not shown). The electrostatic puck 166 described in embodiments may be used for Johnsen-Rahbek and/or Coulombic electrostatic chucking in embodiments.

In one embodiment, a protective ring 146 is disposed over a portion of the electrostatic puck 166 at an outer perimeter of the puck 166. In one embodiment, the electrostatic puck 166 is coated with a protective layer 136. Alternatively, the electrostatic puck 166 may not be coated by a protective layer 136. The protective layer 136 may be a ceramic such as $Y_2O_3$ (yttria or yttrium oxide), $Y_4Al_2O_9$ (YAM), $Al_2O_3$ (alumina), $Y_3Al_5O_{12}$ (YAG), $YAlO_3$ (YAP), Quartz, SiC (silicon carbide), $Si_3N_4$ (silicon nitride) Sialon, AlN (aluminum nitride), AlON (aluminum oxynitride), $TiO_2$ (titania), $ZrO_2$ (zirconia), TiC (titanium carbide), ZrC (zirconium carbide), TiN (titanium nitride), TiCN (titanium carbon nitride), $Y_2O_3$ stabilized $ZrO_2$ (YSZ), and so on.

In one embodiment, the electrostatic puck 166 includes a single ceramic puck plate, which may include heating elements (e.g., for a multi-zone heater such as a 4-zone heater), RF electrodes, chucking electrodes, and so on. In one embodiment, electrostatic puck 166 includes an upper puck plate (not shown) and a lower puck plate (not shown) bonded by a metal and/or organic bond. The puck may also include more than two plates. The single puck plate (or the upper puck plate and/or one or more other plates) may formed from a dielectric or electrically insulative material (e.g., having an electrical resistivity of greater than $10^{14}$ Ohm·meter) that is usable for semiconductor processes at temperatures of 180° C. and above. In one embodiment, the single puck plate or upper puck plate and/or other plate(s) is composed of materials usable from about 20° C. to about 500° C. In one embodiment, the single puck plate, upper puck plate and/or other plate(s) is AlN. The AlN single puck plate, upper puck plate and/or other plate(s) may be undoped or may be doped. For example, the AlN may be doped with Samarium oxide ($Sm_2O_3$), Cerium oxide ($CeO_2$), Titanium dioxide ($TiO_2$), or a transition metal oxide. In one embodiment, the single puck plate, upper puck plate and/or other plate(s) is $Al_2O_3$. The $Al_2O_3$ upper plate plate(s) may be undoped or may be doped. For example, the $Al_2O_3$ may be doped with Titanium dioxide ($TiO_2$) or a transition metal oxide.

If multiple puck plates are used, a lower puck plate and/or one or more other plates may have a coefficient of thermal expansion that is matched to a coefficient of thermal expansion of the upper puck plate. In one embodiment, the lower puck plate and/or other plate(s) is a SiC porous body that is infiltrated with an AlSi alloy (referred to as AlSiSiC). The lower puck plate and/or other plate(s) may alternatively be AlN or $Al_2O_3$. In one embodiment, the lower puck plate and/or other plate(s) is undoped AlN or undoped $Al_2O_3$. In one embodiment, the lower puck plate and/or other plate(s) is composed of the same material as the upper puck plate. The AlSiSiC material, AlN or $Al_2O_3$ may be used, for example, in reactive etch environments or in inert environments.

In one embodiment, the lower puck plate and/or other plate(s) includes Molybdenum. Molybdenum may be used, for example, if the puck 166 is to be used in an inert environment. Examples of inert environments include environments in which inert gases such as Ar, $O_2$, N, etc. are flowed. Molybdenum may be used, for example, if the puck 166 is to chuck a substrate for metal deposition. Molybdenum may also be used for the lower puck plate and/or other plate(s) for applications in a corrosive environment (e.g., etch applications). In such an embodiment, exposed surfaces of the lower puck plate and/or other plate(s) may be coated with a plasma resistant coating after the lower puck plate is bonded to the upper puck plate. The plasma coating may be performed via a plasma spray process.

In embodiments, the substrate support 150 including the electrostatic puck 166 and cooling plate 164 is an electrostatic chuck assembly. In embodiments, a bond layer separating the electrostatic puck 166 from the cooling plate 164 is tailored to ameliorate any thermal non-uniformities that might otherwise be present at a surface of the electrostatic puck 166. The bond layer may be tailored by temporarily securing the electrostatic puck 166 to the cooling plate 164, measuring a thermal uniformity at the surface of the electrostatic puck 166 under one or more temperature settings of heating elements in the electrostatic puck and/or one or more cooling settings for the cooling plate 164, and modifying the bond layer to address identified thermal non-uniformities. Alternatively, the bond layer may be tailored by modeling thermal performance of the substrate support (e.g., using finite element analysis) to identify temperature non-uniformities, and modifying the bond layer to address the temperature non-uniformities. In either example, the electrostatic puck 166 may then be bonded to the cooling plate 164 using the modified bond layer.

The mounting plate 162 is coupled to the bottom 110 of the chamber body 102 and includes passages for routing utilities (e.g., fluids, power lines, sensor leads, etc.) to the cooling plate 164 and the puck 166. The cooling plate 164 and/or puck 166 may include one or more optional embedded heating elements 176, optional embedded thermal isolators 174 and/or optional conduits 168, 170 to control a lateral temperature profile of the substrate support assembly 148. In one embodiment, a thermal gasket and/or o-ring is disposed on at least a portion of the cooling plate 164.

The conduits 168, 170 may be fluidly coupled to a fluid source 172 that circulates a temperature regulating fluid through the conduits 168, 170. The embedded thermal isolators 174 may be disposed between the conduits 168, 170 in one embodiment. The embedded heating elements 176 are regulated by a heater power source 178. The embedded heating elements 176 may be included in one plate of puck 166. The conduits 168, 170 and embedded heating elements 176 may be utilized to control the temperature of the puck 166, thereby heating and/or cooling the electrostatic puck 166 and a substrate (e.g., a wafer) being processed. In one embodiment, the electrostatic puck 166 may include two or more separate heating zones that can maintain distinct temperatures. In another embodiment, the electrostatic puck 166 includes four different heating zones that can maintain distinct temperatures. The temperature of the electrostatic puck 166 and the thermally conductive base 164 may be monitored using multiple temperature sensors 190, 192, which may be monitored using a controller 195.

The electrostatic puck 166 may further include multiple gas passages such as grooves, mesas and other surface features that may be formed in an upper surface of the puck 166. The gas passages may be fluidly coupled to a source of a heat transfer (or backside) gas, such as He via holes drilled in the electrostatic puck 166. In operation, the backside gas may be provided at controlled pressure into the gas passages to enhance the heat transfer between the electrostatic puck 166 and the substrate 144.

In one embodiment, the electrostatic puck 166 includes at least one clamping electrode 180 controlled by a chucking power source 182. The clamping electrode 180 (also referred to as a chucking electrode) may further be coupled to one or more RF power sources 184, 186 through a matching circuit 188 for maintaining a plasma formed from process and/or other gases within the processing chamber 100. In one embodiment, a different RF electrode or set of electrodes are connected to one or more RF power sources 184, 186 and used for maintaining a plasma. The RF electrode(s) may be included in one plate of electrostatic puck 166. The one or more RF power sources 184, 186 may be capable of producing an RF signal having a frequency from about 50 kHz to about 3 GHz and a power of up to about 10,000 Watts. In one embodiment, an RF signal is applied to the metal base, an alternating current (AC) is applied to the heater and a direct current (DC) is applied to the clamping electrode 180.

Figure 2:
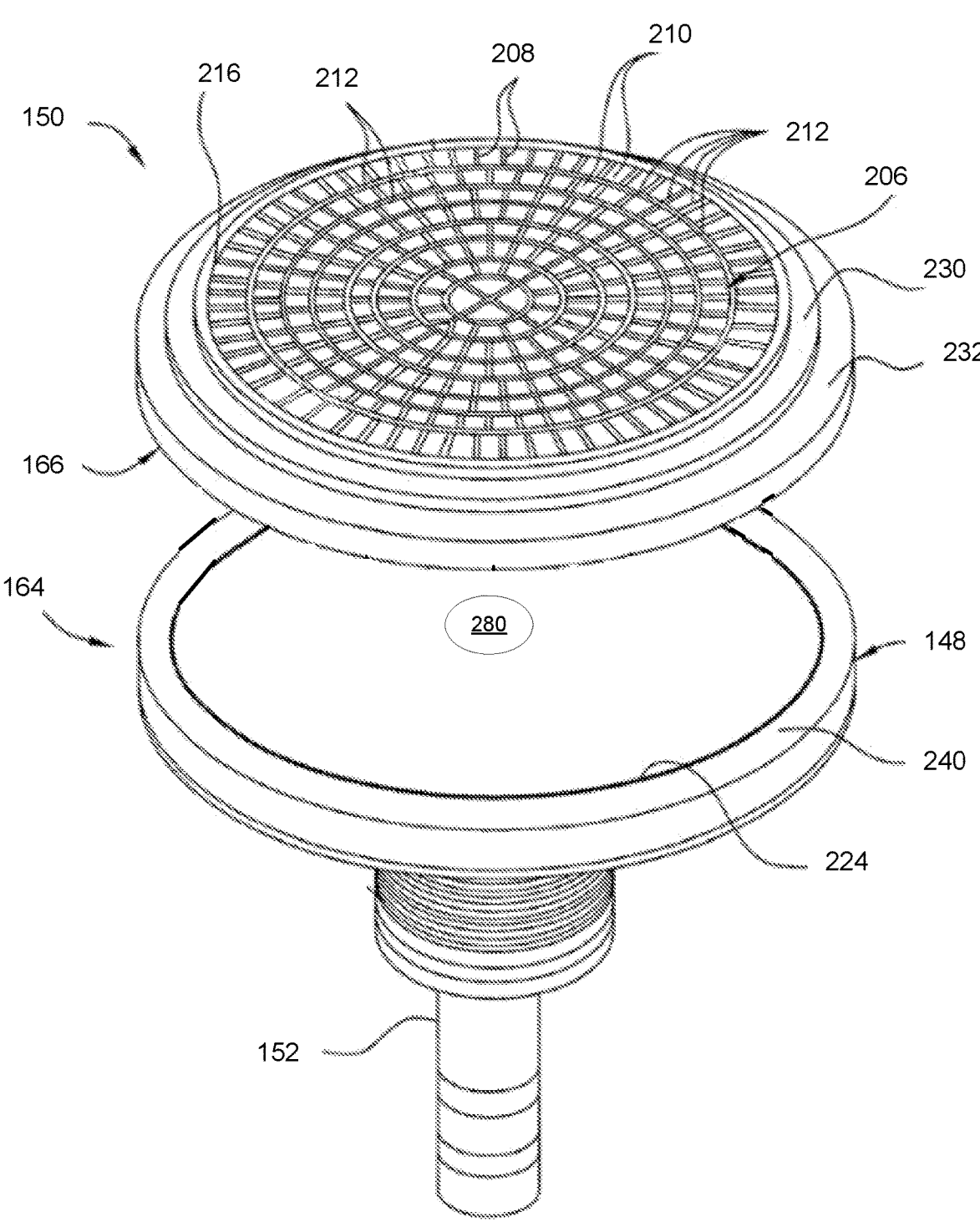
FIG. 2 depicts an exploded view of one embodiment of a substrate support assembly.

FIG. 2 depicts an exploded view of one embodiment of the substrate support assembly 148. The substrate support assembly 148 depicts an exploded view of the substrate support 150 including the electrostatic puck 166 and the pedestal 152. The substrate support 150 includes the electrostatic puck 166, as well as the cooling plate 164 attached to the electrostatic puck 166. As shown, an o-ring 240 may be vulcanized to the cooling plate 164 along a perimeter of a top side of the cooling plate 164. Alternatively, the o-ring may be disposed on the top side of the cooling plate 164 without being vulcanized thereto. Alternatively, no o-ring may be used in some embodiments. Some embodiments are discussed herein with reference to o-rings and gaskets that are vulcanized to at least a portion of the cooling plate 164. However, it should be understood that the o-rings and/or gaskets may alternatively be vulcanized to the lower puck plate. Alternatively, the o-rings and/or gaskets may not be vulcanized to any surface. In one embodiment, the o-ring 240 or gasket is a perfluoropolymer (PFP) o-ring or polyimide o-ring or gasket. Alternatively, other types of high temperature o-rings may be used. Examples of PFPs usable for the gasket or o-ring 240 are Dupont's™ ECCtreme™, Dupont's KALREZ® and Daikin's® DUPRA™. In one embodiment, thermally insulating high temperature o-rings or gaskets are used.

Additional o-rings (not shown) or gaskets may also be vulcanized to or disposed on the top side of the cooling plate around a hole 280 at a center of the cooling plate 164 through which cables or terminal wires may be run. Other smaller o-rings or gaskets may also be vulcanized to or disposed on the cooling plate 164 around other openings, around lift pins, and so forth. The o-ring 240 or gasket may provide a vacuum seal between a chamber interior volume and interior volumes within the substrate support 150. The interior volumes within the substrate support 150 may include open spaces within the pedestal 152 for routing conduits and wiring.

In one embodiment, the electrostatic puck 166 is bonded to cooling plate 164 by a bond, such as a metal bond, a polymer bond, an organic bond, a ceramic bond, etc. In one embodiment, the electrostatic puck 166 is secured to cooling plate 164 using one or more fasteners. In one embodiment, the cooling plate 164 includes numerous features (not shown) through which fasteners are inserted. Fasteners may extend through each of the features and attach to additional portions of the fasteners (or additional fasteners) that are inserted into additional features formed in the electrostatic puck 166. For example, a bolt may extend through a feature in the cooling plate 164 and be screwed into a nut disposed in a feature of the electrostatic puck 166. Each feature in the cooling plate 164 may line up to a similar feature (not shown) in electrostatic puck 166.

In one embodiment, the electrostatic puck 166 has a disc-like shape having an annular periphery that may substantially match the shape and size of the substrate positioned thereon. An upper surface of the electrostatic puck 166 may have an outer ring 216, multiple mesas 206, 210 and channels 208, 212 between the mesas 210. In one embodiment, the electrostatic puck 166 includes an upper puck plate 230 bonded to the lower puck plate 232 by a bond (e.g., by a metal bond, an organic bond, a polymer bond, a silicone bond, a ceramic bond, etc.).

The cooling plate 164 attached below the electrostatic puck 166 may have a disc-like main portion 224 and an annular flange extending outwardly from the main portion 224 and positioned on the pedestal 152. In one embodiment, the cooling plate 164 may be fabricated by a metal, such as aluminum or stainless steel or other suitable materials. Alternatively, the cooling plate 164 may be fabricated by a composite ceramic, such as an aluminum-silicon alloy infiltrated SiC or Molybdenum to match a thermal expansion coefficient of the electrostatic puck 166. The cooling plate 164 should provide good strength and durability as well as heat transfer properties.

Figure 3:
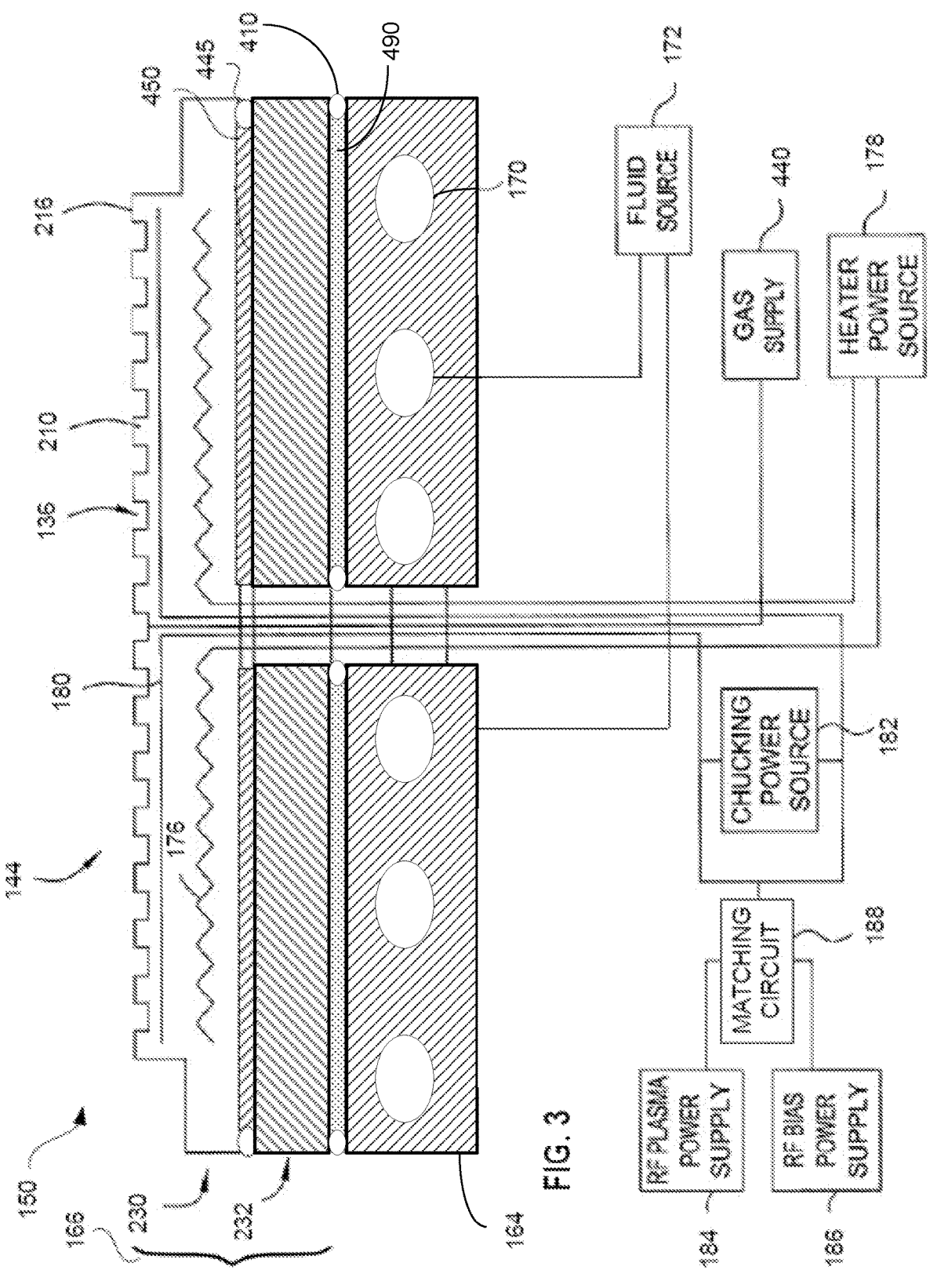
FIG. 3 depicts a sectional side view of one embodiment of a substrate support assembly.

FIG. 3 depicts a sectional side view of one embodiment of a substrate support 150. The substrate support 150 includes an electrostatic puck 166 made up of an upper puck plate 230, and a lower puck plate 232 that are bonded together by a bond layer 450, which may be a metal bond, an organic bond, a polymer bond, a silicone bond, a ceramic bond, a polyimide bond, and/or a type of bond that uses a preformed bond layer that may be disposed between the upper puck plate 230 and lower puck plate 232 to form the bond 450. In some embodiments, upper puck plate 230 is a ceramic plate and lower puck plate 232 is a polyimide plate. In an alternative embodiment, the electrostatic puck assembly 166 may be formed of a single monolithic ceramic plate, or may include more than two plates. The substrate support (e.g., electrostatic chuck assembly) 150 may alternatively have more than two plates, such as three plates, four plates, five plates, six plates, and so on, for example. Plates may include ceramic plates and polyimide plates.

Different techniques may be used to bond the multiple plates. One technique that may be used for bonding is metal bonding. Polymer bonding, diffusion bonding, organic bonding, and so on may also be performed to bond plates together. In some embodiments, all plates are bonded using a same bonding technique. In some embodiments, different bonding techniques are used for different plates. In one embodiment, diffusion bonding is used as a method of metal bonding plates of the substrate support 150 together. In one embodiment, the upper puck plate 230 and the lower puck plate 232 comprise materials which include aluminum (e.g., AlN or Al₂O₃). Bond layer 450 may be a metal bond that may include an "interlayer" of aluminum foil which is placed in a bonding region between the upper puck plate 230 and the lower puck plate 232 in an embodiment. Pressure and heat may be applied to form a diffusion bond between the aluminum foil and the upper puck plate 230 and between the aluminum foil and lower puck plate 232. In another embodiment, the diffusion bond may be formed using other interlayer materials which are selected based upon the materials used for upper puck plate 230 and lower puck plate 232. In another embodiment, the upper puck plate 230 may be directly bonded to the lower puck plate 232 using direct diffusion bonding in which no interlayer is used to form the bond. An organic bond, ceramic bond, polymer bond, or other type of bond may also be formed to bond the plates together. In another embodiment, upper puck plate 230 is a ceramic plate that includes one or more chucking electrodes and/or RF electrodes (and that may not include heating electrodes), lower puck plate is a polyimide plate that includes one or more heating elements, and bonding layer 450 is a polyimide bonding layer (e.g., such as an HKJ polyimide film, a Kapton® polyimide film, etc.). For example, lower puck plate 232 may be a polyimide thermofoil heater.

In one embodiment, an o-ring 445 is used to protect bond 450. A plasma resistant and high temperature o-ring 445 may be made of a perfluoropolymer (PFP) or polyimide in embodiments. The o-ring 445 may be a PFP with inorganic additives such as SiC in an embodiment. The o-ring may be replaceable. When the o-ring 445 degrades it may be removed and a new o-ring may be stretched over the upper puck plate 230 and placed at a perimeter of the electrostatic puck 166 at an interface between the upper puck plate 230 and the lower puck plate 232. The o-ring 445 may protect the metal bond 450 from erosion by plasma. In some embodiments, no o-ring is used to protect the bond 450.

The upper puck plate 230 includes mesas 210, channels 212 and an outer ring 216. In one embodiment, the upper puck plate 230 includes clamping electrodes 180 and one or more heating elements 176. Alternatively, the clamping electrodes 180 and heating elements 176 may be disposed in different plates (e.g., heating elements and/or clamping electrodes may be disposed in lower puck plate 232). The clamping electrodes 180 may be coupled to a chucking power source 182, and/or to an RF plasma power supply 184 and/or an RF bias power supply 186 via a matching circuit 188. The upper puck plate 230, lower puck plate 232 and/or other plates may additionally include gas delivery holes (not shown) through which a gas supply 440 pumps a backside gas such as He.

The upper puck plate 230 may have a thickness of about 3-25 mm. The clamping electrodes 180 may be located about 1 mm from an upper surface of the upper puck plate 230, and the heating elements 176 may be located about 1 mm under the clamping electrodes 180. The heating elements 176 may be screen printed heating elements having a thickness of about 10-200 microns. Alternatively, the heating elements may be resistive coils that use about 1-3 mm of thickness of the upper puck plate 230. In such an embodiment, the upper puck plate 230 may have a minimum thickness of about 5 mm. In one embodiment, the lower puck plate 232 has a thickness of about 8-25 mm.

The heating elements 176 are electrically connected to a heater power source 178 for heating the upper puck plate 230. The upper puck plate 230 may include electrically insulative materials such as AlN. The upper puck plate 230 may alternatively or additionally include $Al_2O_3$ and/or another ceramic material. The lower puck plate 232 and upper puck plate 232 (and/or one or more other plates) may be made of the same materials and/or different materials. In one embodiment, the lower puck plate 232 is made of materials which are different from the materials used for the upper puck plate 230. In one embodiment, the lower puck plate 232 is composed of a metal matrix composite material. In one aspect, the metal matrix composite material includes aluminum and silicon. In one embodiment, the metal matrix composite is a SiC porous body infiltrated with an AlSi alloy.

The lower puck plate 232 is bonded to a cooling plate 164 via a bond layer 490 which may be a metal bond, an organic bond, a polymer bond, a silicone bond, a ceramic bond, and/or other type of bond that uses a preformed bond layer that may be disposed between the electrostatic puck 166 and cooling plate 164 to form the bond. Cooling plate 164 may have one or more conduits 170 (also referred to herein as cooling channels) in fluid communication with a fluid source 172.

In one embodiment, the cooling plate 164 is coupled to the electrostatic puck 166 by multiple fasteners (not shown). The fasteners may be threaded fasteners such as nut and bolt pairs.

In one embodiment (as shown), an o-ring 410 is vulcanized to (or otherwise disposed on) the cooling plate at a perimeter of the cooling plate 164 to protect bond layer 490. Alternatively, the o-ring 410 may be vulcanized or attached to the bottom side of the electrostatic puck 166.

In one embodiment, the cooling plate 164 includes a base portion. In one embodiment, o-ring 410 may be vulcanized to the base portion. In one embodiment, the cooling plate 164 includes a spring loaded inner heat sink connected to the base portion by one or more springs. The springs apply a force to press the inner heat sink against the electrostatic puck 166. A surface of the heat sink may have a predetermined roughness and/or surface features (e.g., mesas) that control heat transfer properties between the puck 166 and the heat sink. Additionally, the material of the heat sink may affect the heat transfer properties. For example, an aluminum heat sink will transfer heat better than a stainless steel heat sink. In one embodiment, the heat sink includes a grafoil layer on an upper surface of the heat sink.

Substrate support assemblies, such as electrostatic chucks, may perform as expected in a simulated environment. However, when they are in operation the temperature profile of the substrate support surface may not be uniform across the surface. The non-uniformity in temperature may be because of variation in resistances of the heating elements, variation in RF elements embedded in the puck plate, variation in material density of the puck plates, and/or other operational factors. These variations may impact the heating of the wafer on the substrate support surface, cooling of the wafer on the substrate support surface, and the non-uniformity in the temperature profile of the substrate support surface may impact the material properties of the substrate being formed. For example, cold spots and/or hot spots may develop at the surface of the substrate support, which translates to cold spots and/or hot spots on a supported wafer. A cold spot or hot spot may alter a deposition rate at an affected region, may alter an etch rate at an effected region, and/or otherwise change one or more properties of one or more layers or devices on the substrate. In order to avoid or mitigate such imperfections, it is beneficial to have a uniform temperature profile (e.g., with less than 1° C. variation) across the substrate support surface. Accordingly, embodiments of the present disclosure provide methods for improving thermal uniformity of a substrate support surface of a substrate support assembly, and for substrate supports that have been modified according to such methods. Embodiments also relate to a substrate support assembly with a uniform temperature profile (e.g., with less than 1° C. variation) across a substrate support surface. Embodiments also relate to a computational model for simulating a temperature profile of a substrate support surface of a substrate support assembly and modifying one or more properties of a bonding material between a ceramic puck plate and a cooling plate of the substrate support assembly in order to achieve a uniform temperature profile (e.g., with less than 1° C. variation) across the substrate support surface.

FIG. 4 illustrates an example substrate support assembly 400, such as an electrostatic chuck, according to one or more embodiments. The substrate support assembly 400 may include one or more puck plates 402, which may be similar to the electrostatic puck 166 described in FIGS. 1-3. Puck plate 402 may be partially or fully bonded to a cooling plate 406, which may be similar to the cooling plate 164 described in FIGS. 1-3. The cooling plate 406 may include one or more cooling channels or conduits 410, which may be similar to the cooling channels or conduits 170 described in FIGS. 1-3. The cooling plate 406 and puck plate 402 may be partially or fully bonded using a bonding layer 404, which may include a bonding material such as a metal bonding material, a silicone bonding material, a ceramic bonding material, and/or an organic bonding material. In one embodiment, the bonding layer may have an average thickness of about 50, 100, 150, 200, 250, 300, 350, 400 or more microns (e.g., may be a silicone sheet having a thickness of about 300 microns). The one or more puck plates 402 can be made of the same material or different materials. Examples of materials that may be used include, but are not limited to, niobium, aluminum oxide, aluminum nitride, and sapphire. In some embodiments, the puck plates 402 may include the same material or different materials, the same material with different purities, the same material with different grain sizes, or different materials with different grain sizes.

Each of the puck plates 402 may include one or more functional elements, such as a clamping electrode, a zone heater or primary/main heater, a pixelated heater or auxiliary heater, a radio frequency (RF) electrode, a gas channel, a gas pocket, or combinations thereof. In some embodiments, one plate may include a smaller number of main heater electrodes, and another plate may include a larger number of auxiliary heater electrodes. In some embodiments, the main heater electrodes may be configured to handle greater power than the auxiliary heater electrodes. In some embodiments, one or more polyimide heaters may be attached to the puck plates 402 to heat the puck plates 402 via radiation from the outside. In some embodiments, one or more polyimide heaters may be embedded within the body of the puck plates 402 to beat the puck plates 402 to a target or desired temperature. A polyimide heater may include a polyimide plate or disc with embedded heating elements. In some embodiments, a polyimide heater is a polyimide plate that is bonded to a bottom of a ceramic plate. Accordingly, puck plates 402 may include ceramic plates and/or polyimide plates. In some embodiments, puck plates 402 include a single puck plate.

The puck plates 402 can be separated from cooling plate 406 by one or more bonding layers 404. The bonding layer(s) 404 may include silicone, a ceramic, any metal, such as Ni, Ti, C, Si, or combinations thereof.

Bonding layer 404 may include a preformed sheet of bonding material, such as a sheet of silicone. The sheet of bonding material may have a shape that corresponds to a shape of the cooling plate 406 and/or puck plate(s) 402. The sheet of bonding material may include cutouts for a central cavity (e.g., for routing of electrical wires), cutouts for gas delivery holes, cutouts for lift pins, and so on. The sheet of bonding material may also have been custom altered to ameliorate thermal non-uniformities in the substrate support 400. Although illustrated as one homogeneous layer, bonding layer 404 can be formed in any pattern that may be suitable for the purpose of bonding the puck plate 402 to the cooling plate 406. In some embodiments, the bonding layer 404 may take the form of an array, a checkered layer, multiple rows separated by a uniform or non-uniform space, multiple columns separated by uniform or non-uniform spaces, multiple layers of bonding material stacked on each other, etc.

Bonding layer 404 may include a metal bond layer, an organic bond layer, a polymer bond layer, a silicone bond layer, or a ceramic bond layer, or a combination thereof. The organic bond layer may be formed of any organic material, including but not limited to, an organic elastomer or any polymeric material.

The substrate support assembly 400 may have a substrate support surface 408 on which a substrate or wafer may be placed. In some embodiments, one or more properties of the bonding layer 404 can be modified to alter the uniformity of temperature on the substrate support surface 408. The modifications to the properties of the bonding layer 404 can be determined based on temperature readings from or estimates for the puck plate 402 alone, based on temperature readings from or estimates for the cooling plate 406 alone, based on temperature readings from or estimates for the entire substrate support assembly 400 including the puck plate 402, the bonding layer 404, and the cooling plate 406 together. For example, if a region on the substrate support surface 408 has a temperature that is higher than a target temperature, then that portion of the substrate support surface 408 is likely not receiving enough cooling from the cooling plate 406. Accordingly, a thickness of the bonding layer 404 between the puck plate 402 and the cooling plate 406 in this region may be reduced so that it receives additional cooling from the cooling plate 406. Similarly, if a region on the substrate support surface 408 has a temperature that is lower than the desired temperature, then that portion of the substrate support surface 408 is likely receiving too much cooling from the cooling plate 406. Accordingly, a thickness of the bonding layer 404 between the puck plate 402 and the cooling plate 406 in this region may be increased or one or more holes may be introduced to the bond layer at this region so that it receives lesser cooling from the cooling plate 406. The change in thickness, shape, properties and/or composition of the bonding layer 404 may depend on the original thickness of the bonding layer 404 and the thermal conductivity of the bonding material that forms the bonding layer 404. Other modifications such as creating one or more perforations in the body of the bond layer 404 or filling one or more perforations with another bonding material having a thermal conductivity that is lower than, greater than, or equal to a thermal conductivity of the original bonding material may also be performed. In embodiments, hole patterns to apply are determined based on a difference between a target temperature at a region and a measured temperature at a region. The hole pattern may include more holes and/or larger holes if the temperature delta is greater and fewer holes and/or smaller holes if the temperature delta is lesser in embodiments. In some embodiments, a hole pattern includes a greater density of holes at a central portion of a region and gradually reduces a density of holes at a periphery of the region. This may enable a gradual change in the cooling and/or heating performance of the bonding layer at the region and/or at an intersection between the region and a neighboring region.

Figure 5:
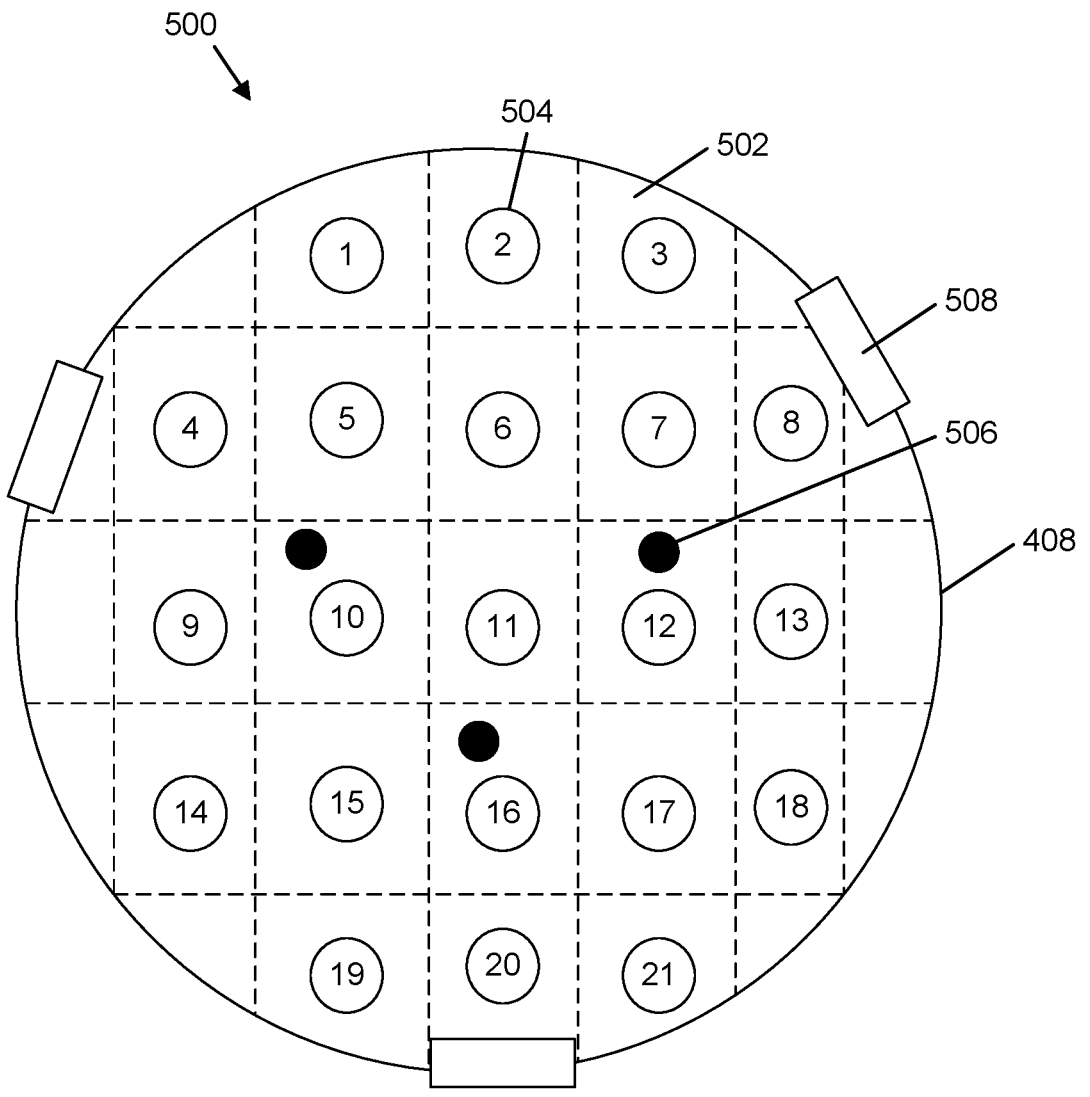
FIG. 5 illustrated a top view of a substrate support assembly, in accordance with one or more embodiments.

FIG. 5 illustrates a top view of a substrate support assembly 500 with improved thermal uniformity, according to one or more embodiments. In the substrate support assembly 500, the puck plate 302, bonding layer 305, and the cooling plate 306 may be aligned using one or more alignment pins 506, which may be installed on a lower puck plate, on the cooling plate, or on both. The puck plate 302, bonding layer 305, and the cooling plate 306 may be temporarily clamped using one or more clamps 508, which may be mounted along the perimeter of the substrate support assembly. The clamps 508 may apply sufficient force so that the pressure between the cooling plate 306 and the bonding layer 305, and the bonding layer 305 and the puck plate 302 is similar or equal to the pressure applied when the substrate support assembly is in normal operation. The substrate support surface 308 may be divided into multiple regions 502 depending on the area of the substrate support surface 308 and a resolution with which the temperature of the substrate support is to be modified. The substrate support assembly 500 is then turned on so the heating elements in the puck plate 302 are fully operational and the cooling channels or conduits 310 in the cooling plate 306 are fully operational. The heating elements may be powered to apply heat, and coolant may be provided to the cooling plate to provide cooling at one or more operational temperatures or other test temperatures. A temperature value 504 at each of the regions 502 on the substrate support surface 308 may be recorded for further processing of the bonding layer 305, which will be described in further detail with respect to FIG. 6 below.

Figure 6:
FIG. 6 illustrates example data for improving thermal uniformity of a substrate support surface of a substrate support assembly, in accordance with one or more embodiments.

FIG. 6 illustrates example data 600 that may be used to modify one or more properties of the bonding layer 304. Data 600 may include multiple regions 602, which correspond to regions 502 illustrated in FIG. 5. Example temperature values 604 for each of these regions 602 is recorded and an average temperature 606 may be determined based on the individual temperature values 604 recorded. The system may determine a difference between the individual temperature values 604 and the average temperature 606, for each of the regions 602. Based on the difference between the individual temperature values 604 and the average temperature 606, or based on the difference between the individual temperature values 604 and a target temperature for the substrate support surface 308, the system may determine a thickness correction factor 610 (in microns) for modifying a thickness of the bonding layer 404. The thickness correction factor 610 may be based on an average thickness of the bonding layer 404 and a temperature difference between the puck plate 402 and the cooling plate 406. For example, if the thickness of the bonding layer 404 is about 100 microns, and the difference in temperature between the puck plate 402 and the cooling plate 406 is about 20° C., then a delta factor may be determined as being 100/20=6 microns per degree C. So for every 1° C. change in temperature, the thickness of the bonding layer would be modified by 6 microns. In other words, if the temperature in a region 602 is to be increased by 1° C., then the thickness of the bonding layer 404 would be increased by 6 microns. Similarly, if the temperature in a region 602 has to be decreased by 1° C., then the thickness of the bonding layer 404 would be decreased by 6 microns. In some embodiments, the thickness of the bonding layer is not increased. In such embodiments, the thickness correction factors may be normalized to a target maximum thickness (e.g., so that a maximum positive thickness correction factor is set to 0, and an amount that was subtracted from the maximum thickness correction factor to reach 0 is also subtracted from each of the other thickness correction factors).

In the example illustrated in FIG. 6, since region 1 has a temperature value 604 that is greater than the average temperature 606, the thickness of the bonding layer 404 would be reduced by 0.48 microns so that the puck plate 402 receives more cooling from the cooling plate 406, and the temperature value 604 in that region may be reduced. Similarly, since region 2 has a temperature value 604 that is lesser than the average temperature 606, the thickness of the bonding layer 404 may be increased by 1.62 microns so that the puck plate 402 receives lesser cooling from the cooling plate 406, and the temperature value 604 in that region may be increased, and so on and so forth. Alternatively, the temperature at such a region may be increased by drilling one or more holes at that region (e.g., via laser drilling) and filling the holes with a material having a higher thermal conductivity than that of the bonding layer 404. Although the difference between the individual temperature values 604 and the average temperature 606 is used in the example illustrated in FIG. 6, the modifications to the properties of the bonding layer 304 (e.g., thickness) can also be based on the difference between the individual temperature values 604 and a desired temperature for the substrate support surface 408, or a thermal conductivity of the bonding layer 404, etc.

Figures 7A, 7B, 7C:
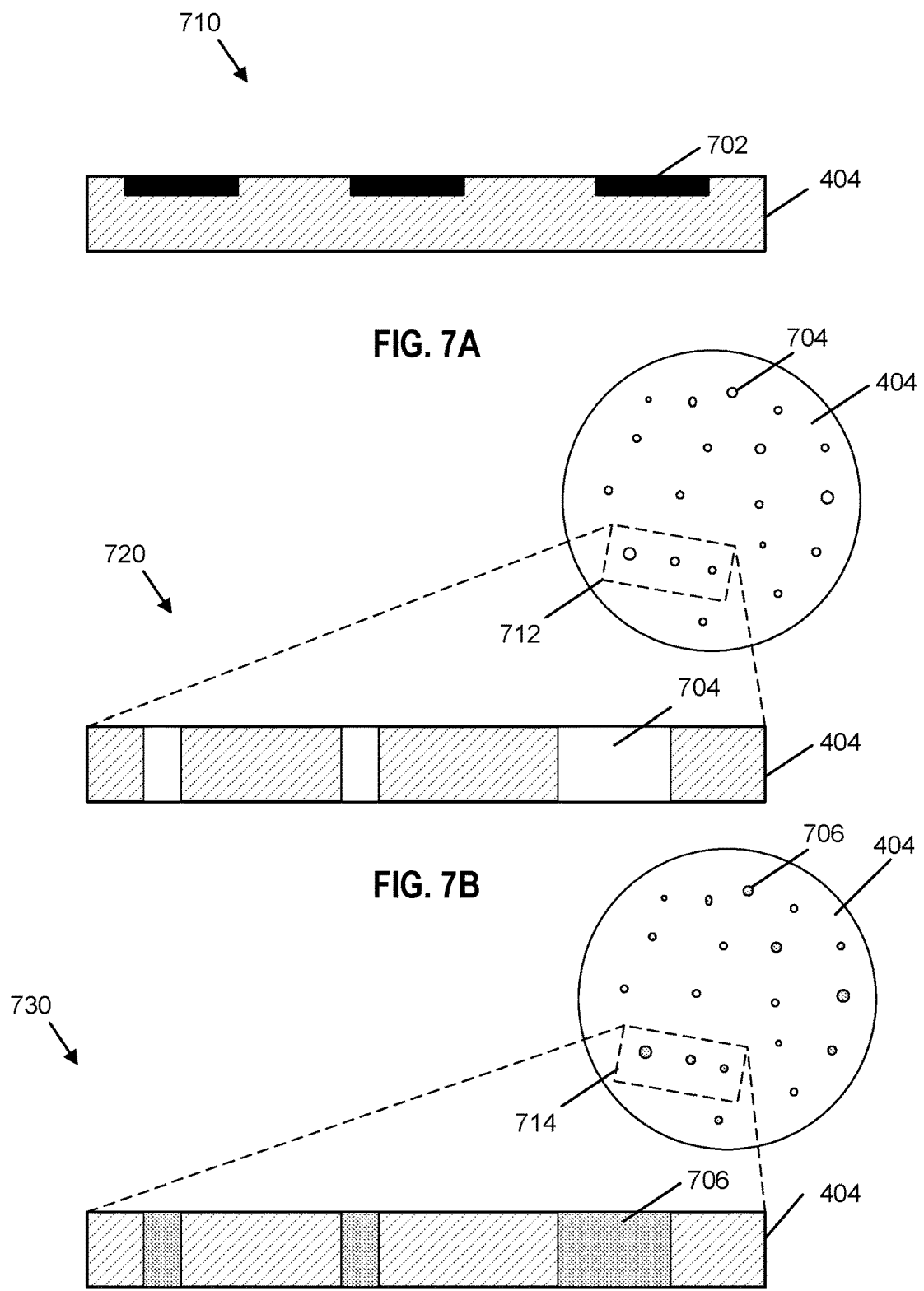
FIGS. 7A-7C depict a sectional side view of a bonding layer in a substrate support assembly, in accordance with one or more embodiments.

FIG. 7A illustrates a cross-sectional view of an example bonding layer 710 whose thickness is modified or reduced at one or more locations 702 based on the determination made in FIG. 6. In some embodiments, the thickness of bonding layer 704 may be reduced using etching or a material removal process that may be performed by laser rastering or laser drilling apparatus. The amount of thickness that may be reduced may range from less than a micron (e.g., a fraction of a micron) to about 100 microns or more. In other words, the laser rastering or laser drilling apparatus may have a precision of less than a micron (e.g., a fraction of a micron). FIG. 7B illustrates an alternative embodiment where instead of modifying a thickness of the bonding layer 404, one or more perforations 704 are made into a body of the bonding layer 404. A blown-up cross-sectional view of the dotted portion 712 in bonding layer 404 is shown in 720 where multiple perforations 704 are formed in a body of the bonding layer 408 to enable slower or less efficient cooling from the cooling plate 307. Although perforations 704 are illustrated as through holes, in some embodiments, the perforations may not be through holes and may instead be formed in the shape of a valley with a closed bottom or trough. In embodiments, perforations may include clusters of drilled holes, one or more drilled holes having a same or different sizes, groupings of drilled holes having different hole density patterns, and so on. In some embodiments, a computer program (e.g., the electrostatic chuck design analysis module 1050 shown in FIG. 10) may be used to determine hole sizes and/or locations of the perforations 704 to be formed in the bonding layers, and such information may be provided to a laser drilling apparatus (not shown) to perform the drilling of the perforations 704 in the determined sizes and/or determined locations 702. In some embodiments, a computer program may determine a hole pattern based on a determined temperature profile.

In some embodiments, one or more of the perforations 704 may be filled with another bonding material 706 that has thermal conductivity that may be greater than, less than, or equal to the thermal conductivity of the original bonding material that forms the bonding layer 404. FIG. 7C illustrates a blown-up cross-sectional view 730 of a portion 714 of the bonding layer 408 where a second bonding material 706 is filled into the perforations 704 illustrated in FIG. 7B. Although the second bonding material 706 is shown to fully fill the perforations 704, in some embodiments, the second bonding material 706 may only partially fill the perforations 704. In some embodiments, a piezojet printer or a three-dimensional printer may be coupled to the computer program (e.g., the electrostatic chuck design analysis module 1050 shown in FIG. 10), which may be used to at least partially fill the second bonding material 706 in one or more perforations 704. In some embodiments, the second bonding material may include any suitable material, including but not limited to, liquid silicone, polytetrafluoroethylene (PTFE), any fluoro elastomer, or a perfluoro elastomer. In some embodiments, the filler material includes silicone with one or more additives, such as metal particles that increase a thermal conductivity of the filler material. In some embodiments, the added metal particles are shaped to provide different thermal conductivity in different directions. Accordingly, the filler material may provide anisotropic thermal conductivity, where thermal conductivity may be different in an x direction, z direction and/or y direction. For example, oval shaped metal particles may provide anisotropic thermal conductivity. By filling drilled holes or perforations completely or partially with a filler material having an increased thermal conductivity, a cooling performance at those regions may be increased in embodiments.

Figure 8:
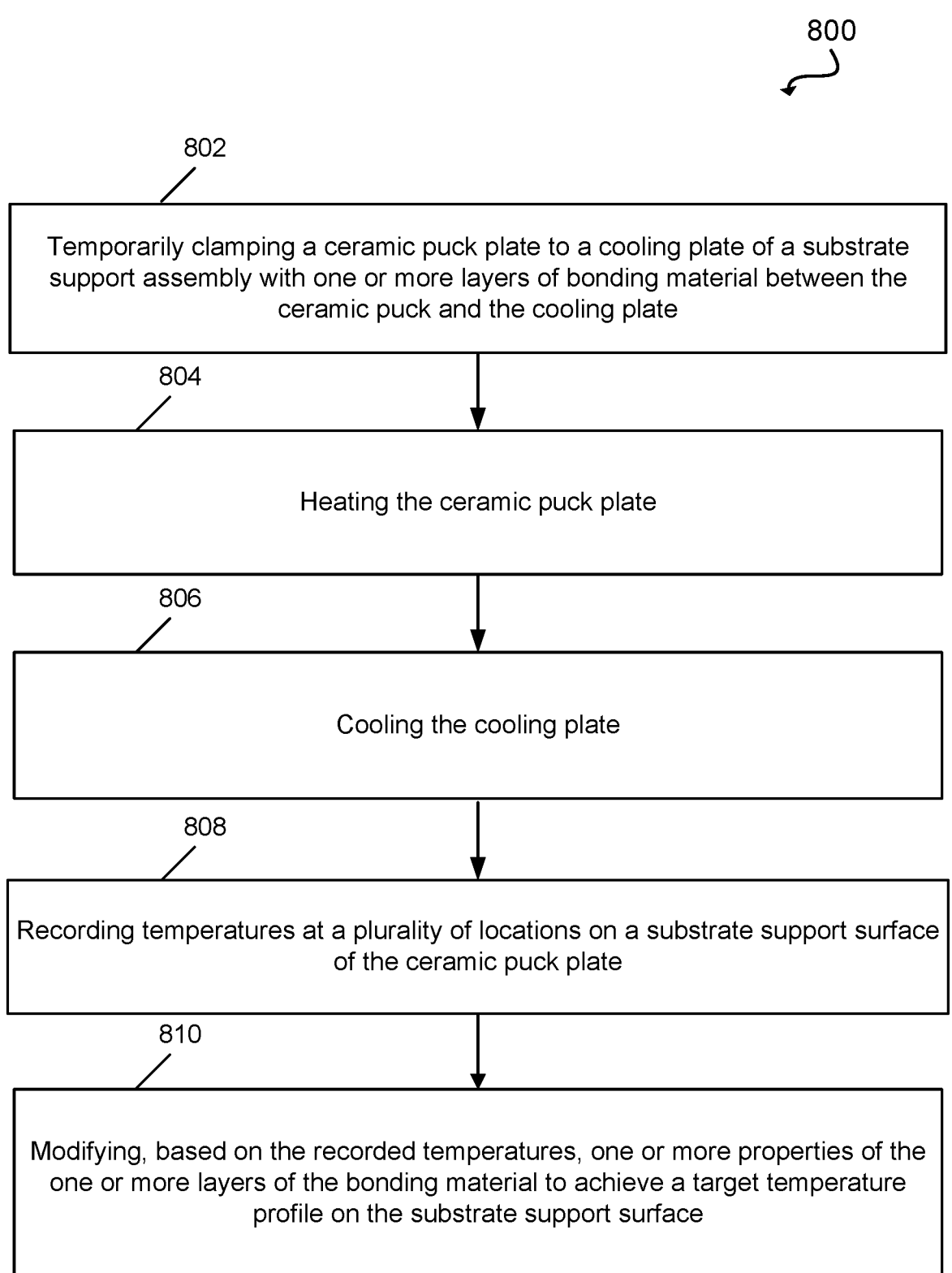
FIG. 8 illustrates a method for improving thermal uniformity of a substrate support surface of a substrate support assembly, in accordance with one or more embodiments.

FIG. 8 illustrates example operations in a method 800 for improving thermal uniformity of a substrate support surface of a substrate support assembly, according to one or more embodiments. The method 800 may be implemented in a processing chamber (e.g., chamber 100 of FIG. 1) or outside of a processing chamber. The method 800 can be carried out manually or it may be simulated using one or more computational models in a simulation environment. At block 802, a ceramic puck plate, one or more layers of a bonding material, and a cooling plate are temporarily clamped together, in that order. At block 804, the ceramic puck plate may be heated to one or more target temperatures and/or one or more operational temperatures. In embodiments, a temperature profile across the surface of the substrate support is determined at a target temperature of around 70 degrees C., at a target temperature of around 100 degrees C., at a target temperature of around 150 degrees C. and/or at one or more other target temperatures. At block 806, a coolant is allowed to flow to the cooling plate to cool the cooling plate to one or more target temperatures and/or one or more operational temperatures. The coolant may flow to the cooling plate via one or more cooling channels (e.g., channels 170 shown in FIG. 3). At block 808, temperature readings at multiple locations on a substrate support surface of the puck plate can be measured. Additional temperature readings can be measured on the cooling plate and/or from the entire substrate support assembly including the puck plate, the bonding layer, and the cooling plate together.

At block 808, one or more hot spots and/or cold spots at the surface of the ceramic puck plate may be determined based on the recorded temperatures. Based on the hot spots and/or cold spots (e.g., temperatures at those regions), temperatures at other regions, an average temperature, a target temperature, etc., one or more temperature deltas may be determined. The temperature deltas may represent a targeted change in temperature to achieve at the regions. At block 810, one or more properties of the bonding layer can be modified to alter the uniformity of temperature on the substrate support surface to achieve the one or more determined temperature deltas. The modifications to the properties of the bonding layer can be determined based on temperature readings from the puck plate alone, based on temperature readings from the cooling plate alone, or based on temperature readings from the entire substrate support assembly including the puck plate, the bonding layer, and the cooling plate together.

In an example, if a region on the substrate support surface has a temperature that is higher than a target temperature, then that portion of the substrate support surface is likely not receiving enough cooling from the cooling plate. Accordingly, a thickness of the bonding layer between the puck plate and the cooling plate in this region may be reduced so that it receives additional cooling from the cooling plate. The amount of additional cooling to target, and an amount of thickness reduction to apply at that region to achieve the additional amount of cooling may be determined based on known thermal properties of the bonding layer, the ceramic puck plate and/or the cooling plate. Similarly, if a region on the substrate support surface has a temperature that is lower than the target temperature, then that portion of the substrate support surface is likely receiving too much cooling from the cooling plate. Accordingly, a thickness of the bonding layer between the puck plate and the cooling plate in this region may be increased so that it receives lesser cooling from the cooling plate, and/or holes may be drilled at that region to reduce a thermal conductivity of the bonding layer at that region. The change in thickness of the bonding layer may depend on the original thickness of the bonding layer and the thermal conductivity of the bonding material that forms the bonding layer. Other modifications such as creating one or more perforations in the body of the bond layer or filling one or more perforations with another bonding material having a thermal conductivity that is lower than, greater than, or equal to a thermal conductivity of the original bonding material may also be performed.

In one embodiment, processing logic directs an automated drilling device, robot device and/or polishing device (e.g., that may be controlled by a computer numerical control (CNC) machine to polish or machine the one or more regions and/or drill holes at the one or more regions and/or fill holes with a filler material according to the determined modifications. In embodiments, the CNC machine uses a laser to perform laser machining (e.g., to remove between about 1-100, 1-50, 1-10, etc. microns of thickness) and/or to perform laser drilling at targeted regions of the bonding layer. Once the bonding layer material is modified, the ceramic puck plate may be bonded to the cooling plate using the modified bonding layer.

FIG. 9 illustrates a flow diagram for a method 900 of performing analysis on a digital design of an electrostatic chuck using a trained machine learning model, in accordance with one embodiment. One or more operations of method 900 are performed by processing logic of a computing device. The processing logic may include hardware (e.g., circuitry, dedicated logic, programmable logic, microcode, etc.), software (e.g., instructions executed by a processing device), firmware, or a combination thereof. For example, one or more operations of method 900 may be performed by a processing device executing an electrostatic chuck design analysis module 1050 of FIG. 10. It should be noted that the method 900 may be performed for each unique electrostatic chuck or substrate support assembly.

At block 902, the processing logic may perform computational modeling to model heating a ceramic puck plate bonded to a cooling plate by one or more layers of a bonding material. Thermal properties and/or other properties of the bonding layer, cooling plate and/or ceramic puck plate may be input into the model to accurately model the thermal properties (e.g., heating and/or cooling) of the substrate support assembly. At block 904, the processing logic may estimate temperatures at a plurality of locations on a substrate support surface of the ceramic puck plate based on the computational modeling. At block 906, the processing logic may determine, based on the computational modeling, modifications to one or more properties of the one or more layers of the bonding material to achieve a target temperature profile on the substrate support surface. At block 908, the processing logic may determine modifications to the one or more properties of the one or more layers of the bonding material in accordance with the determined modifications. This may include determining one or more changes in thickness to apply to one or more regions of the bonding material, hole patterns to drill at one or more regions of the bonding material, one or more filler materials for filing of one or more hole patterns, and so on. In one embodiment, processing logic directs an automated drilling device, robot device and/or polishing device (e.g., that may be controlled by a computer numerical control (CNC) machine to polish the one or more regions and/or drill holes at the one or more regions and/or fill holes with a filler material.

In one example, the processing logic may receive one or more properties of the ceramic puck plate, one or more properties of the cooling plate, and/or properties of the one or more layers of the bonding material, which may be used as inputs for the computational model in the simulation environment. In one implementation, the processing logic prepares a computational model for the ceramic puck plate bonded to the cooling plate by the one or more layers of the bonding material based on the one or more properties of the ceramic puck plate, one or more properties of the cooling plate, and/or properties of the one or more layers of the bonding material. In some embodiments, the processing logic may receive the temperatures recorded at the plurality of locations and perform finite element analysis (FEA) to determine the temperatures at various locations of the substrate support assembly and/or modifications to the one or more properties of the one or more layers of the bonding material.

In some embodiments, the numerical simulation may include finite element method, finite difference method, finite volume method, meshfree methods, smoothed-particle methods, combinations of these methods, or the like. Finite element method (also referred to as finite element analysis) may refer to a numerical method for solving partial differential equations, which can also be applied to perform structural analyses and/or thermal analyses of electrostatic chucks. The geometry of structure (in this case electrostatic chuck) is discretized to a number of points or elements over a domain to solve a set of partial differential equations characterizing the constitutive relations of the electrostatic chuck material (e.g., cooling plate, bonding layer, ceramic puck plate, etc.), and solutions are explored in the finite dimensional functional space. Finite difference method may refer to a numerical method for solving differential equations by approximating them with difference equations and calculating approximate values at discrete points. Finite volume method may refer to a method for representing and evaluating partial differential equations in the form of algebraic equations. Finite volume method may also calculate values (e.g., strain, stress, force) at discrete places on a meshed geometry of the digital design of the electrostatic chuck. "Finite volume" may refer to the small volume surrounding each point on a mesh. Meshfree methods may refer to methods that are based on interaction of nodes or points with all of the neighboring nodes or points. In other words, meshfree methods do not require connection between nodes of the simulation domain. The smoothed-particle Galerkin or hydrodynamics method may be forms of meshfree methods.

A simulation environment can include, e.g., computer modeling systems, mechanical systems or apparatus, thermodynamic analysis systems, and the like. Optionally, digital models of the appliance and/or teeth can be produced, such as finite element models. The finite element models can be created using computer program application software available from a variety of vendors. For creating solid geometry models, computer aided engineering (CAE) or computer aided design (CAD) programs can be used, such as the AutoCAD® software products available from Autodesk, Inc., of San Rafael, CA. For creating finite element models and analyzing them, program products from a number of vendors can be used, including finite element analysis packages from ANSYS, Inc., of Canonsburg, PA, and SIMULIA (Abaqus) software products from Dassault Systèmes of Waltham, MA.

Figure 10:
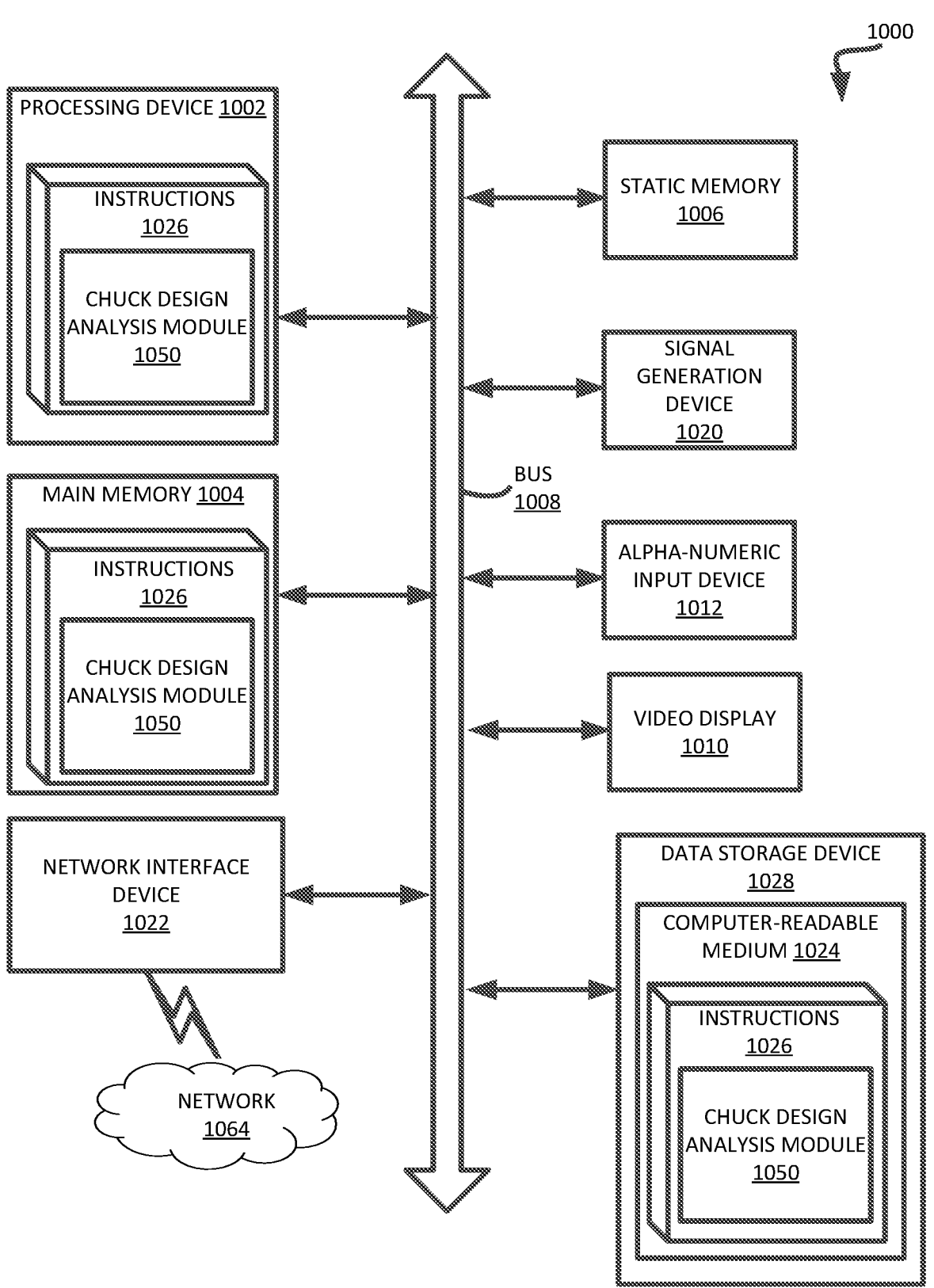
FIG. 10 illustrates a block diagram of an example computing device, in accordance with embodiments of the present disclosure.

FIG. 10 illustrates a diagrammatic representation of a machine in the example form of a computing device 1000 within which a set of instructions, for causing the machine to perform any one or more of the methodologies discussed herein (e.g., the methods of FIGS. 8-9). In some embodiments, the machine may be part of a design station or communicatively coupled to the design station. In alternative embodiments, the machine may be connected (e.g., networked) to other machines in a Local Area Network (LAN), an intranet, an extranet, or the Internet. For example, the machine may be networked to the design station and/or a rapid prototyping apparatus such as a 3D printer or SLA apparatus. The machine may operate in the capacity of a server or a client machine in a client-server network environment, or as a peer machine in a peer-to-peer (or distributed) network environment. The machine may be a personal computer (PC), a tablet computer, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The example computer device 1000 (also referred to as a computing device) includes a processing device 1002, a main memory 1004 (e.g., read-only memory (ROM), flash memory, dynamic random access memory (DRAM) such as synchronous DRAM (SDRAM), etc.), a static memory 1006 (e.g., flash memory, static random access memory (SRAM), etc.), and a secondary memory (e.g., a data storage device 1028), which communicate with each other via a bus 1008.

Processing device 1002 represents one or more general-purpose processors such as a microprocessor, central processing unit, or the like. More particularly, the processing device 1002 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 1002 may also be one or more special-purpose processing devices such as an application specific integrated circuit (ASIC), a field programmable gate array (FPGA), a digital signal processor (DSP), network processor, or the like. Processing device 1002 is configured to execute the processing logic (instructions 1026) for performing operations and steps discussed herein.

The computing device 1000 may further include a network interface device 1022 for communicating with a network 1064. The computing device 1000 also may include a video display unit 1010 (e.g., a liquid crystal display (LCD) or a cathode ray tube (CRT)), an alphanumeric input device 1012 (e.g., a keyboard), a cursor control device 1010 (e.g., a mouse), and a signal generation device 1020 (e.g., a speaker).

The data storage device 1028 may include a machine-readable storage medium (or more specifically a non-transitory computer-readable storage medium) 1024 on which is stored one or more sets of instructions 1026 embodying any one or more of the methodologies or functions described herein. A non-transitory storage medium refers to a storage medium other than a carrier wave. The instructions 1026 may also reside, completely or at least partially, within the main memory 1004 and/or within the processing device 1002 during execution thereof by the computer device 1000, the main memory 1004 and the processing device 1002 also constituting computer-readable storage media.

The computer-readable storage medium 1024 may also be used to store one or more digital models of electrostatic chucks and/or dental arches (also referred to as electronic models) and/or an electrostatic chuck design analysis module 1050, which may perform one or more of the operations of the methods described herein. The computer-readable storage medium 1024 may also store a software library containing methods that call an electrostatic chuck design analysis module 1050. In some embodiments, the electrostatic chuck design analysis module 1050 may determine hole sizes and/or locations of the holes to be formed in the bonding layers, and such information may be provided to a laser drilling apparatus (not shown) to perform the drilling of the holes in the determined sizes and/or determined locations. While the computer-readable storage medium 1024 is shown in an example embodiment to be a single medium, the term "computer-readable storage medium" should be taken to include a single medium or multiple media (e.g., a centralized or distributed database, and/or associated caches and servers) that store the one or more sets of instructions. The term "computer-readable storage medium" shall also be taken to include any medium that is capable of storing or encoding a set of instructions for execution by the machine and that cause the machine to perform any one or more of the methodologies of the present disclosure. The term "computer-readable storage medium" shall accordingly be taken to include, but not be limited to, solid-state memories, and optical and magnetic media.

The preceding description sets forth numerous specific details such as examples of specific systems, components, methods, and so forth, in order to provide a good understanding of several embodiments of the present disclosure. It will be apparent to one skilled in the art, however, that at least some embodiments of the present disclosure may be practiced without these specific details. In other instances, well-known components or methods are not described in detail or are presented in simple block diagram format in order to avoid unnecessarily obscuring the present disclosure. Thus, the specific details set forth are merely exemplary. Particular implementations may vary from these exemplary details and still be contemplated to be within the scope of the present disclosure.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner. In one embodiment, multiple metal bonding operations are performed as a single step.

It is to be understood that the above description is intended to be illustrative, and not restrictive. Many other embodiments will be apparent to those of skill in the art upon reading and understanding the above description. The scope of the disclosure should, therefore, be determined with reference to the appended claims, along with the full scope of equivalents to which such claims are entitled.

What is claimed is:

1. A method comprising:
temporarily clamping a ceramic puck to a cooling plate of a substrate support assembly with one or more layers of bonding material between the ceramic puck and the cooling plate;
heating the ceramic puck;
cooling the cooling plate;
recording temperatures at a plurality of locations on a substrate support surface of the ceramic puck; and
modifying, based on the recorded temperatures, one or more properties of the one or more layers of the bonding material to achieve a target temperature profile on the substrate support surface.

2. The method of claim 1, wherein modifying the one or more properties comprises:
determining an average temperature of the temperatures recorded at the plurality of locations;
determining respective temperature deviations from the average temperature for one or more locations of the plurality of locations; and
determining, based on the respective temperature deviations of the one or more locations, modifications to the one or more properties of the one or more layers of the bonding material.

3. The method of claim 1, wherein modifying the one or more properties of the one or more layers of the bonding material comprises changing a thickness of the one or more layers of the bonding material at one or more locations of the one or more layers.

4. The method of claim 2, further comprising:
determining a ratio of a thickness of the bonding material to a difference in temperature between the ceramic puck and the cooling plate; and
determining a change in the thickness of the one or more layers of the bonding material at the one or more locations based on the temperature deviations at the one or more locations and on the ratio of the thickness of the bonding material to the difference in temperature between the ceramic puck and the cooling plate.

5. The method of claim 1, wherein modifying the one or more properties of the one or more layers of the bonding material comprises creating one or more perforations at one or more locations in the one or more layers of the bonding material.

6. The method of claim 5, wherein modifying the one or more properties of the one or more layers of the bonding material further comprises:
at least partially filling the one or more perforations with a second material having a thermal conductivity that is lower than, greater than, or equal to a thermal conductivity of the bonding material.

7. The method of claim 6, wherein the second material comprises at least one of silicone and a ceramic material comprising aluminum oxide, aluminum nitride, or a polycrystalline diamond powder.

8. The method of claim 1, further comprising:
disposing the modified one or more layers of the bonding material between the ceramic puck and the cooling plate; and at least partially bonding the ceramic puck to the cooling plate using the modified one or more layers of the bonding material.

9. The method of claim 1, wherein the ceramic puck is a multi-plate electrostatic puck comprising an upper puck plate and a lower puck plate, the method further comprising:

temporarily clamping the upper puck plate to the lower puck plate with one or more additional layers of bonding material between the upper puck plate and the lower puck plate; and modifying, based on the recorded temperatures, one or more properties of the one or more additional layers of the bonding material to achieve the target temperature profile on the substrate support surface.

10. A method comprising:

performing computational modeling to model heating a ceramic puck plate bonded to a cooling plate by one or more layers of a bonding material;

estimating temperatures at a plurality of locations on a substrate support surface of the ceramic puck plate based on the computational modeling;

determining, based on the computational modeling, modifications to one or more properties of the one or more layers of the bonding material to achieve a target temperature profile on the substrate support surface; and modifying the one or more properties of the one or more layers of the bonding material in accordance with the determined modifications.

11. The method of claim 10, further comprising:

receiving one or more first properties of the ceramic puck plate;

receiving one or more second properties of the cooling plate;

receiving one or more third properties of the one or more layers of the bonding material; and preparing a computational model for the ceramic puck plate bonded to the cooling plate by the one or more layers of the bonding material based on the one or more first properties, the one or more second properties, and the one or more third properties.

12. The method of claim 11, wherein receiving one or more first properties of the ceramic puck plate further comprises:

heating the ceramic puck plate;

cooling the cooling plate; and recording temperatures at a plurality of locations on a substrate support surface of the ceramic puck plate.

13. The method of claim 12, wherein determining the one or more properties further comprises:

receiving the temperatures recorded at the plurality of locations; and performing finite element analysis (FEA) to determine modifications to the one or more properties of the one or more layers of the bonding material.

14. The method of claim 11, wherein receiving one or more second properties of the cooling plate further comprises:

cooling the cooling plate; and recording temperatures at a plurality of locations on a top surface of the cooling plate.

15. A substrate support assembly comprising:

a ceramic puck;

a cooling plate; and one or more layers of a bonding material disposed between the ceramic puck and the cooling plate, the bonding material to at least partially bond the ceramic puck to the cooling plate, wherein the one or more layers of the bonding material comprise at least one of:

one or more first locations having a reduced thickness as compared to an average thickness of the one or more layers of the bonding material, one or more second locations comprising perforations to reduce a thermal conductivity of the one or more layers of the bonding material at the one or more second locations, or one or more third locations comprising perforations at least partially filled with a second material to adjust the thermal conductivity of the one or more layers of the bonding material at the one or more third locations.

16. The substrate support assembly of claim 15, wherein the one or more layers of the bonding material comprise a first thickness at a first location and a second thickness at a second location, wherein the first thickness is greater than the second thickness.

17. The substrate support assembly of claim 15, wherein the one or more layers of the bonding material comprise one or more perforations at the one or more second locations.

18. The substrate support assembly of claim 15, wherein at the one or more third locations the perforations are at least partially filled with the second material having a thermal conductivity that is lower than, greater than, or equal to a thermal conductivity of the bonding material.

19. The substrate support assembly of claim 15, wherein the one or more layers of the bonding material are tuned to cause the ceramic puck to have an approximately uniform temperature profile.

20. The substrate support assembly of claim 15, wherein the ceramic puck is a multi-plate electrostatic puck comprising an upper puck plate bonded to a lower puck plate.

* * * * *